United States Patent [19]
Gianfortune et al.

[11] Patent Number: 5,774,018
[45] Date of Patent: Jun. 30, 1998

[54] LINEAR AMPLIFIER SYSTEM AND METHOD

[75] Inventors: Paul A. Gianfortune, Redondo Beach; Thomas M. Straus, Los Angeles, both of Calif.

[73] Assignee: Hughes Electronics Corporation, Los Angeles, Calif.

[21] Appl. No.: 715,530

[22] Filed: Sep. 18, 1996

[51] Int. Cl.$^6$ .................................. H03F 3/66; H03F 1/26
[52] U.S. Cl. ............................. 330/52; 330/149; 330/151
[58] Field of Search .............................. 330/52, 149, 151

[56] References Cited

U.S. PATENT DOCUMENTS 5,570,063  10/1996  Eisenberg ................................ 330/149
5,621,354  4/1997  Mitzlaff ..................................... 330/52

OTHER PUBLICATIONS

Seidel, H., "A Microwave Feed–Forward Experiment", *The Bell System Technical Journal*, Nov., 1971, pp. 2879–2914.

*Primary Examiner*—Steven Mottola
*Attorney, Agent, or Firm*—Elizabeth E. Leitereg; Terje Gudmestad; Michael W. Sales

[57] ABSTRACT

Complex additional feed-forward error sensor loops and error correction loops are replaced in a high-frequency multi-carrier signal amplifier system with simple signal predistortor structures. In addition, less costly error amplifiers are facilitated and system efficiency increased by the introduction of error predistortor structures.

19 Claims, 3 Drawing Sheets

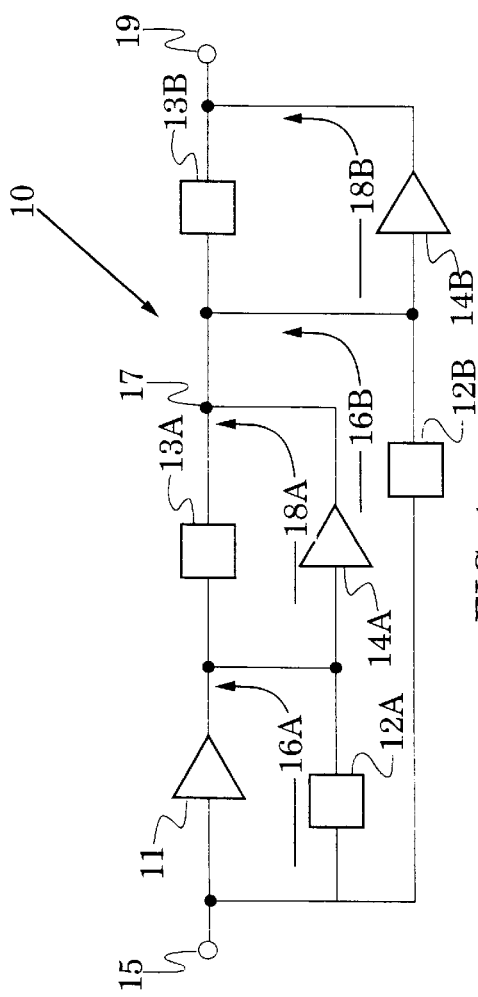
FIG. 1 (PRIOR ART)
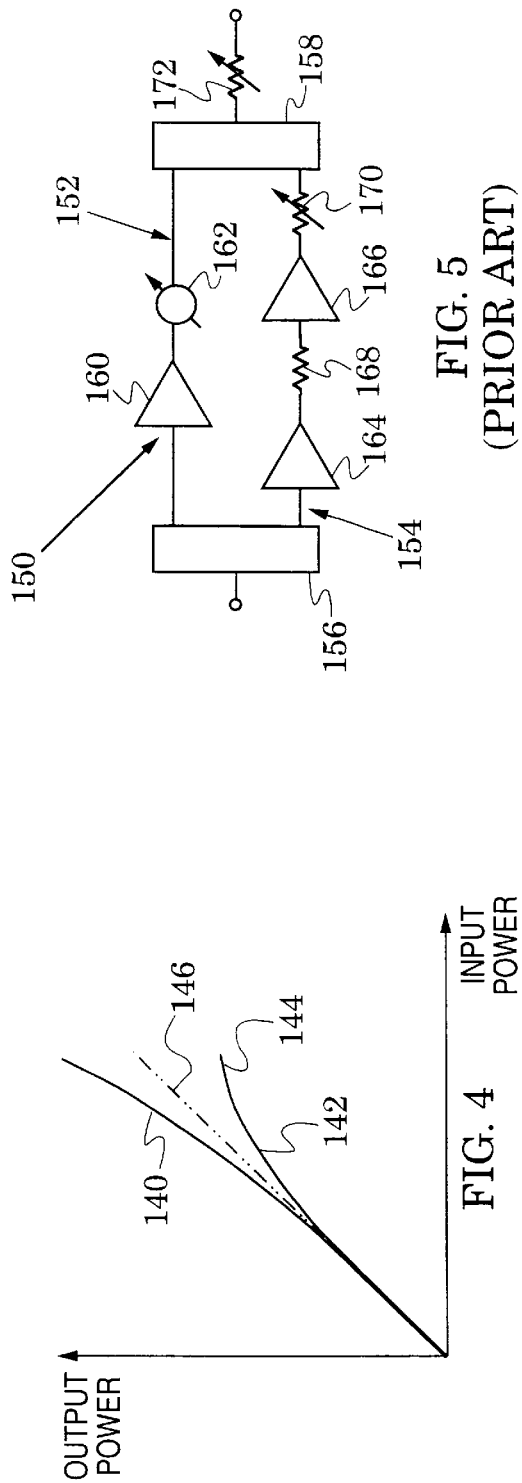
FIG. 4
FIG. 5 (PRIOR ART)

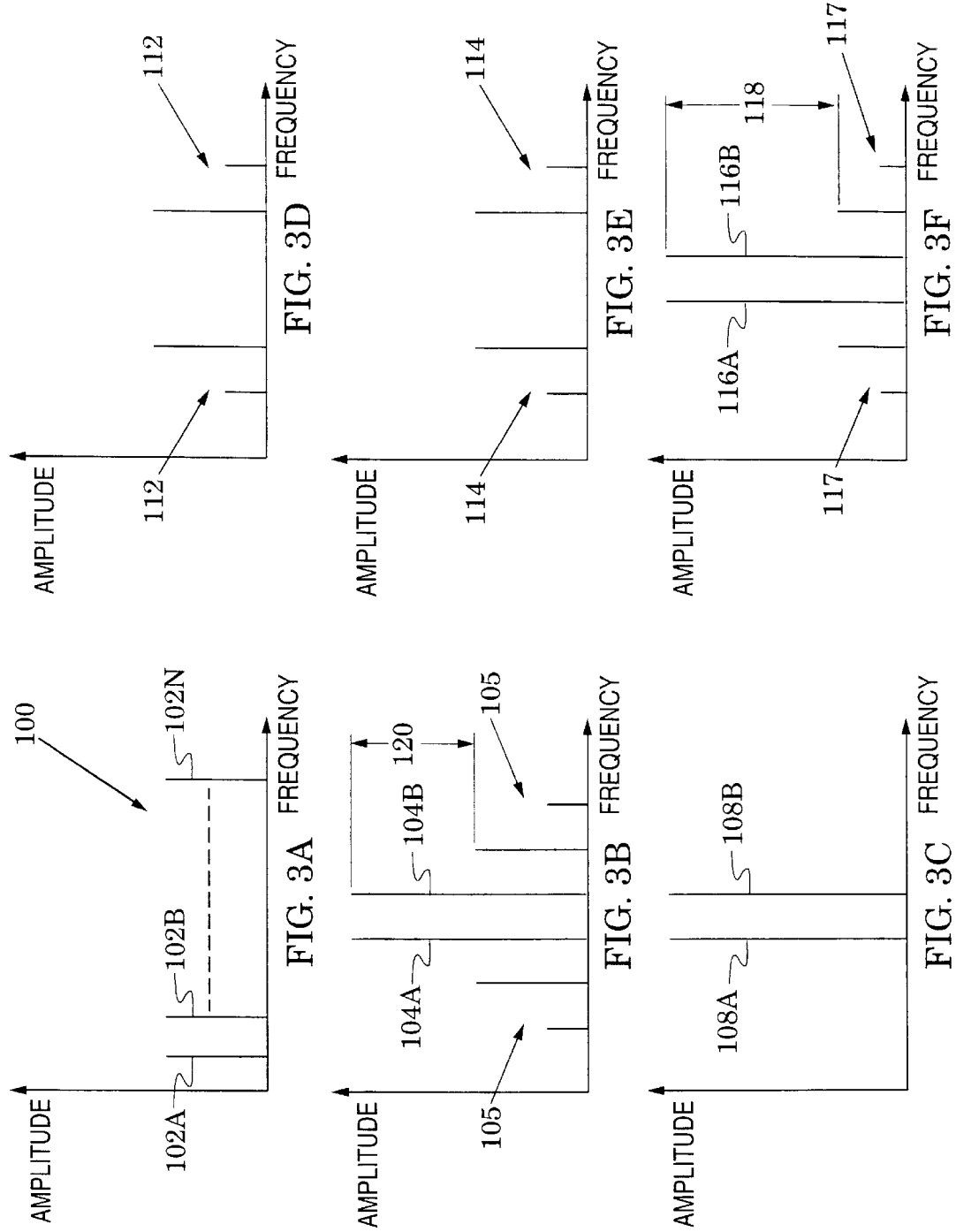

LINEAR AMPLIFIER SYSTEM AND METHOD

BACKGROUND OF THE INVENTION

1. Field of the Invention

The present invention relates generally to high-power radio frequency and microwave amplifiers.

2. Description of the Related Art

High-power radio frequency and microwave amplifiers are often used to amplify multiple carrier signals in a variety of communication systems (e.g., wireless television, cellular telephone base stations, satellite links and point-to-point microwave links). In such systems, each of the carrier signals generally has a predetermined frequency and is modulated with information signals (e.g., the audio and video signals of a television channel).

To protect the integrity of the modulated information, most communication systems require that the power of spurious signals be below the power of each carrier by a specified amount. A specification on spurious signal power is generally expressed as decibels below the carrier power (dbc). Thus a system having a 60 dbc specification requires that the power of any spurious signal be at least 60 db below the nominal carrier power.

Unfortunately, all amplifiers have some nonlinearity in their transfer characteristic (the relationship between input power, and amplified output power). When multiple carrier signals are processed through an amplifier, this nonlinearity generates a host of intermodulation signals. For example an amplified first carrier signal having a first frequency and an amplified second carrier signal having a second frequency will be accompanied by intermodulation signals with frequencies that are described by m times the first frequency plus and minus n times the second frequency. The power in these intermodulation signals decreases, i.e., the dbc value increases, as the amplifier linearity increases.

Accordingly, control techniques, e.g., feedback and feed-forward control loops, have been developed which are directed to increasing the linearity, i.e. reducing the error, of amplifier systems. Feedback control requires instantaneous comparison of an amplified signal with its corresponding input signal. Because these signals are not simultaneous events, they are not truly capable of instantaneous comparison. In practice, they are substantially simultaneous if device speeds are much faster than the intelligence rate of the feed back. However, this assumption becomes less valid with increased system frequencies and bandwidths.

In contrast, feed-forward control techniques (as described, for example, in Seidel, H., "A Microwave Feed-Forward Experiment", The Bell System Technical Journal, November, 1971, pp. 2879–2914) exhibit freedom from transit time limitations which makes these techniques particularly suitable for use in systems that operate with high frequencies and wide bandwidths. Although feed-forward control has been successfully used to produce linear amplifiers that generate high power across significant frequency bandwidths, this performance has generally been realized with complex structures and low efficiency. As an example of low efficiency, a state-of-the-art solid state amplifier generates ~200 watts across a frequency band of ~869–894 MHz with an efficiency of ~12% and typical class-AB amplifier performance is 50 watts with an efficiency in the range of 5–7%.

SUMMARY OF THE INVENTION

The present invention is directed to reducing the complexity and increasing the efficiency of high-power amplifier systems without sacrificing linearity. Amplifiers of the invention are especially useful in multi-carrier systems which have exacting intermodulation requirements.

These goals are achieved with the recognition that system complexity can be decreased without sacrificing linearity in high-frequency, large-bandwidth applications by combining predistortion and simple feed-forward control structures. In addition to reducing the complexity of feed-forward control loops, this recognition also facilitates the use of less costly control-loop error amplifiers and an increase in system efficiency.

The invention reduces the distortion in an amplified signal which is amplified from an input signal by an amplifier that has a nonlinear amplifier transfer characteristic. This distortion reduction is obtained by processing the input signal with a predistortion transfer characteristic which is configured so that a signal transfer characteristic which is the series combination of the predistortion transfer characteristic and the amplifier transfer characteristic is more linear than the amplifier transfer characteristic.

After this processing, the input signal is amplified by the amplifier to obtain the amplified signal and a sample of the amplified signal is compared with a sample of the input signal to generate an error signal which is representative of amplified signal errors that are caused by nonlinearities in the signal transfer characteristic. Finally, the error signal is coupled into the amplified signal to cancel at least a portion of the errors.

The signal predistortor facilitates the removal of an additional error sensor loop and an additional error correction loop from conventional feed-forward amplifier systems while still obtaining substantially equal linearity.

In a system embodiment, the error amplifier is also coupled in series with an error predistortor which has an error predistortor transfer characteristic that is configured to provide an error transfer characteristic for the series combination of the error predistortor and the error amplifier which is more linear than the error amplifier transfer characteristic. This structure permits the replacement of a high-intercept-point error amplifier with a one having a lower intercept point but which is operated closer to its saturation point (for a specified input power, an amplifier's intercept point indicates the generated intermodulation level; a higher intercept amplifier generates lower intermodulation products but is generally more costly). In addition to reducing amplifier cost, lower intercept point amplifiers use less input power so that system efficiency is increased.

A controller can compensate for changes in system environment by adjusting phase shifters and attenuators in both the error sensor loop and the error correction loop to enhance the correlation between the errors and the error signal and to enhance error cancellation.

The novel features of the invention are set forth with particularity in the appended claims. The invention will be best understood from the following description when read in conjunction with the accompanying drawings.

BRIEF DESCRIPTION OF THE DRAWINGS

FIG. 1 is a conceptual schematic of a conventional double-stage, feed-forward, error control system;

FIG. 3A is a diagram which shows multiple input carrier signals that can be amplified by the system of FIG. 1;

FIG. 3B is a diagram which illustrates signals and intermodulation products that are generated by an amplifier in the system of FIG. 1 when it amplifies an exemplary pair of the carrier signals of FIG. 3A;

FIG. 3C is a diagram which illustrates sample signals that are generated in the system of FIG. 1 from an exemplary pair of the carrier signals of FIG. 3A;

FIG. 3D is a diagram which illustrates intermodulation error signals that are generated in the system of FIG. 1 by subtracting the signals of FIGS. 3B and 3C;

FIG. 3E is a diagram which illustrates error signals which are amplified versions of the signals of FIG. 3D;

FIG. 3F is a diagram which illustrates output signals with reduced intermodulation products that are obtained in the system of FIG. 1 by subtracting the signals of FIGS. 3B and 3E;

FIG. 4 is a graph which illustrates the combination of predistortion transfer characteristic with a signal amplifier transfer characteristic to obtain a more linear signal transfer characteristic; and FIG. 5 is block diagram of an exemplary predistortor.

DETAILED DESCRIPTION OF THE PREFERRED EMBODIMENTS

Figure 2:
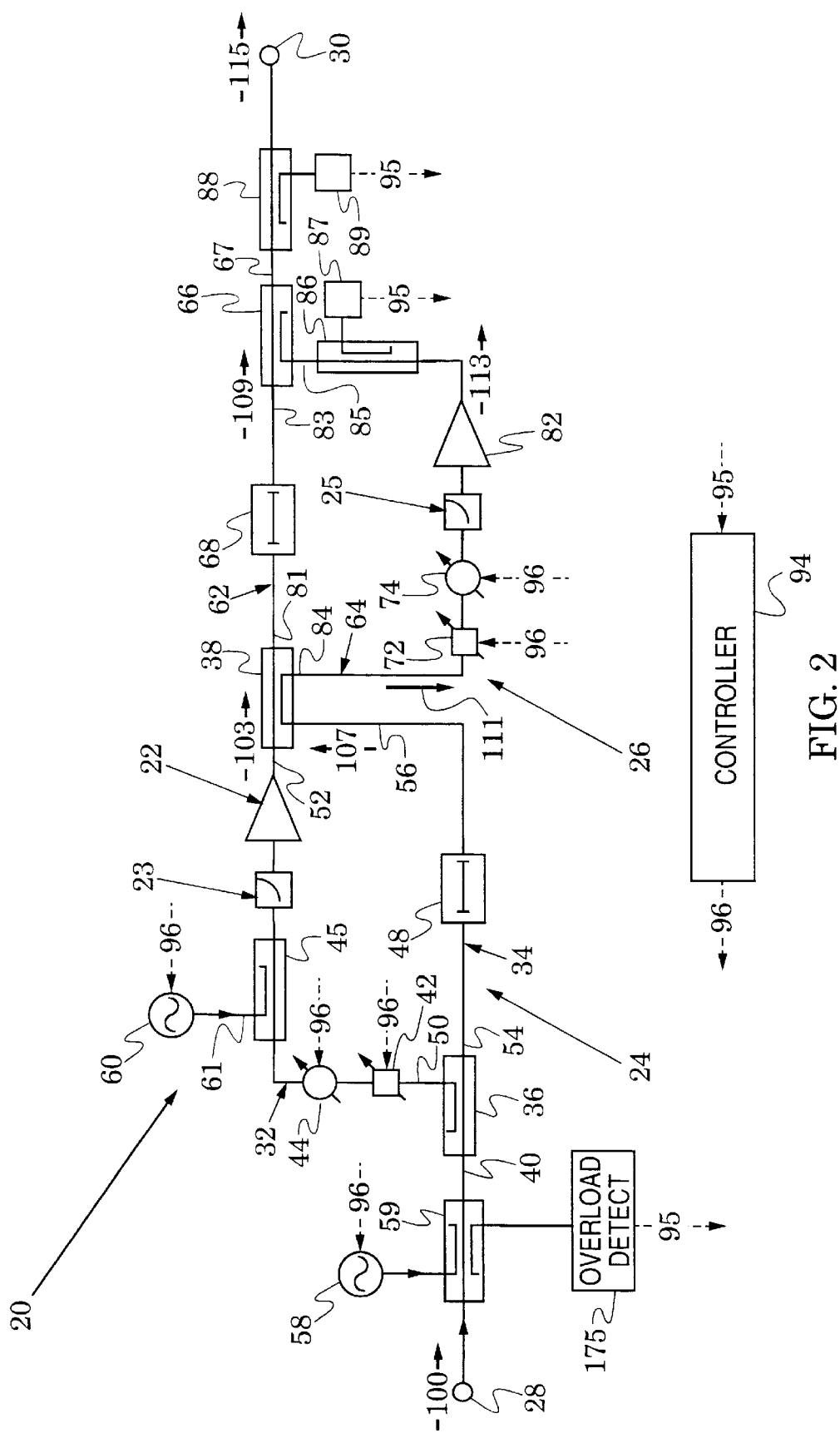
FIG. 2 is a block diagram of a linear amplifier system in accordance with the present invention.

FIG. 1 is a conceptual schematic of a conventional double-stage, feed-forward error control system 10 (as taught, for example, by H. Siedel in the above-cited reference). The system 10 has a signal amplifier 11 arranged in parallel with a delay element 12A and in series with a delay element 13A. An error amplifier 14A is arranged in parallel with the delay element 13A. The signal amplifier 11 and the delay element 12A form a first error sensor loop and the delay element 13A and the error amplifier 14A form a first error correction loop.

In operation of the first error sensor loop and first error correction loop, the delay element 12A couples forward a sample of the input signal at an input port 15 to be compared with a sample of the amplified signal at the output of the signal amplifier 11. This forward-coupling, error sensor loop is indicated by the loop arrow 16A. The difference between the sample of the input signal and the sample of the amplified signal forms an error signal which is representative of the nonlinearities of the signal amplifier 11. This error signal is coupled through the error amplifier 14A and combined with the amplified signal at an output node 17 to cancel at least a portion of the errors. This forward-coupling, error correction loop is indicated by the loop arrow 18A.

Although this portion of the system 10 improves the linearity of the amplifier 11, it has generally been found necessary to add a second error sensor loop and a second error correction loop to meet exacting intermodulation specifications, e.g., 60 dbc.

Accordingly, delay element 12B is conventionally arranged to form a second error sensor loop with the signal amplifier 11 and delay element 13A. This forward-coupling, error sensor loop is indicated by the loop arrow 16B. A delay element 13B and a second error amplifier 14B are arranged to form a second forward-coupling, error correction loop which is indicated by the loop arrow 18B. The error signal developed by the second error sensor loop 16B is coupled through the error amplifier 14B and combined with the amplified signal at an output port 19 to cancel a further portion of the amplifier errors.

Although the additional error sensor loop 16B and error correction loop 18B improve the linearity of the amplifier system 10, they also add considerable cost (e.g., in hardware, assembly time and alignment time) to the system.

The additional error correction loop 18B also increases the output losses which reduces the system efficiency.

In contrast, FIG. 2 illustrates a less complex linear amplifier system 20 which achieves highly linear amplification with a signal amplifier 22 through the combined use of predistortion and feed-forward control techniques. The system 20 combines a signal predistortor 23, a feed-forward error sensor loop 24, an error predistortor 25 and a feed-forward error correction loop 26 between a system input port 28 and a system output port 30.

In particular, the error sensor loop 24 has amplifier and delay arms 32 and 34 which diverge from an input directional coupler 36 and join together in an interloop coupling structure in the form of a directional coupler 38. The system input port 28 is coupled to a direct input 40 of the input directional coupler 36. The amplifier arm 32 includes a variable attenuator 42, a variable phase shifter 44, a sample directional coupler 45, the signal predistortor 23 and the signal amplifier 22 and these elements are connected in series. The delay arm 34 includes a time-delay element in the form of a delay line 48.

The amplifier arm 32 couples signals between a coupled output 50 of the input directional coupler 36 and a direct input 52 of the interloop directional coupler 38. The delay arm 34 couples signals between a direct output 54 of the input directional coupler 36 and a coupled input 56 of the interloop directional coupler 38.

A first pilot-tone generator in the form of a microwave source 58 drives a test directional coupler 59 and a second pilot-tone generator in the form of a microwave source 60 drives a coupled input 61 of the sample directional coupler 45.

The error correction loop 26 has delay and amplifier arms 62 and 64 which diverge from the interloop directional coupler 38 and join together in an output directional coupler 66. The system output port 30 is coupled to a direct output 67 of the output directional coupler 66. The delay arm 62 includes a time-delay element in the form of a delay line 68. The amplifier arm 64 includes a variable attenuator 72, a variable phase shifter 74, the error predistortor 25 and an error amplifier 82 and these elements are connected in series.

The delay arm 62 couples signals between a direct output 81 of the interloop directional coupler 38 and a direct input 83 of the output directional coupler 66. The amplifier arm 64 couples signals between a coupled output 84 of the interloop directional coupler 38 and a coupled input 85 of the output directional coupler 66.

A directional coupler 86 is inserted into the amplifier arm 64 between the error amplifier 82 and the output directional coupler 66 and a detector 87 is coupled to the directional coupler 86. Another directional coupler 88 is inserted between the output directional coupler 66 and the system output port 30 and a detector 89 is coupled to the directional coupler 88.

A controller in the form of a microprocessor 94 receives input monitor signals 95 (indicated by broken-line arrows) from the detectors 87 and 89 and supplies output control signals 96 (also indicated by broken-line arrows) to elements in the error sensor loop 24 and the error correction loop 26. In particular, control signals 96 are supplied to the variable attenuator 42, the variable phase shifter 44, the variable attenuator 72, the variable phase shifter 74 and the signal generators 59 and 60.

An operational description of the amplifier system 20 of FIG. 2 is enhanced by preceding a description of the signal predistortor 23 and the error predistortor 25 with a description of the error sensor loop 24 and the error correction loop 26.

This latter operational description is facilitated with reference to a set of input microwave signals such as the exemplary signal set 100 shown in FIG. 3A. The signal set 100 includes signals 102A–102N. Each of the signals 102A–102N might, for example, be a microwave carrier which has a predetermined frequency and which is modulated with the audio and video signals of a different television channel in a wireless television link.

In operation of the error sensor loop 24, the input signal set 100 is received at the system input port 28 (indicated by the signal arrow 100 in FIG. 2). The power of the signal set 100 is divided in the input directional coupler 36 to form a first power portion at the coupled output 50 and a second power portion at the direct output 54. The first power portion is processed through the elements of the amplifier arm 32 to form an amplified signal set 103 (indicated by the signal arrow 103 in FIG. 2) at the direct input 52 of the second directional coupler 38. The second power portion is processed through the elements of the delay arm 34 to form a delayed sample set 107 (indicated by the signal arrow 107 in FIG. 2) at the coupled input 56 of the second directional coupler 38.

Exemplary signals 104A and 104B of the amplified signal set 103 are shown in FIG. 3B. The signals 104A and 104B are respectively amplified versions of the carrier signals 102A and 102B of FIG. 3A. However, nonlinearities in the signal amplifier 22 will produce intermodulation products 105 which will also be present in the amplified signal set 103. These intermodulation signals typically have frequencies which are the sums and differences of the fundamentals and harmonics of the input signal set 100.

For example, third-order intermodulation products are typically formed in the signal amplifier 22 which are the difference between the second harmonic of one of the signal set 100 less the fundamental harmonic of another of the signal set 100. Third-order intermodulation products are particularly troublesome because their frequencies lie close to the frequencies of the carrier signals 102A–102N from which they are derived. Accordingly, they are difficult to remove with filtering techniques. Fifth-order and seventh-order intermodulation products are also difficult to remove from the signals which produce them. The intermodulation products of the amplified signals of the signal set 103 will be quite numerous. For simplicity of illustration, the intermodulation products are exemplified in FIG. 3B by the products 105 which result from sums and differences of only the amplified signals 104A and 104B and their harmonics.

Because the delayed sample set 107 did not pass through the signal amplifier 22, this sample set of signals are not intermodulated by the nonlinearities of the amplifier. In contrast, they are samples of the carrier signals 102A–102N of FIG. 3A which have been delayed in time. Exemplary signals 108A and 108B of the delayed signal set 107 are shown in FIG. 3C.

Most of the power of the signal set 103 is transmitted to the direct output 81 of the interloop directional coupler 38. Because of the coupling structure of the interloop directional coupler 38, a reduced amplitude version of the signal set 103, e.g., reduced by 50 db, is coupled from the direct input 52 and combined with the signal set 107 which enters the interloop directional coupler 38 on its coupled input 56 to form an error signal set 111 (indicated by the signal arrow 111 in FIG. 2). The coupling loss plus the gains and losses through the amplifier arm 32 are selected to substantially match the losses through the delay arm 34. This match is then improved by adjustment of the variable attenuator 42.

The phase of the signals which are coupled from the signal set 103 can be selected by adjustment of the adjustable phase shifter 96. This selection can be made to set a 180° phase difference between the exemplary amplified carrier signals 104A and 104B of FIG. 3B and the exemplary input carrier samples 108A and 108B of FIG. 3C. Because these signals have the same amplitude but differ in phase by 180°, they cancel so that the error signal set 111 of FIG. 2 includes only the exemplary intermodulation signals 112 shown in FIG. 3D. These intermodulation signals represent the signal errors generated by nonlinearities in the signal amplifier 22.

For clarity, it has been assumed in this operational description that the electrical length of the arms 32 and 34 are equal. If this is not the case, the phase cancellation can only be optimized for a single frequency, e.g., the frequency of the exemplary carrier signal 104A of FIG. 3B. Cancellation between the carrier signal 104B and the sample carrier 108B would then be less than optimum. Accordingly, the time delay of the delay line 48 is selected to match the time delay through the arm 32, i.e., to substantially match the electrical lengths of the arms 32 and 34. With this structure, the phase shifter 44 can be adjusted to obtain carrier cancellation across the bandwidth represented by the signals 102A–102N of FIG. 3A.

Therefore, from the input signal set 100 at the input port 28, the error sensor loop 24 generates an amplified signal set 103 at the direct input 52 of the interloop directional coupler 38, a signal sample set 107 at the coupled input 56 of the interloop directional coupler 38 and an error signal set 111 at the coupled output 84 of the interloop directional coupler 38. In summary, the error sensor loop 24 forms the error signal set 111 by carrier cancellation at the interloop directional coupler 38.

Other embodiments of the invention may use other conventional microwave coupling structures in place of the interloop directional coupler 38. The functions to be performed by such structures are a coupling of a sample of the amplified signal set (103 in FIG. 1) and the combining of this amplified signal sample with the sample input signal set (107 in FIG. 2).

In operation of the error correction loop 26, the amplified signal set 103 (slightly decreased by the insertion loss of the interloop directional coupler 38) is processed through the elements of the delay arm 62. In particular, the signal set is delayed in time and passed to the direct input 83 of the output directional coupler 66 as indicated by the signal arrow 109 in FIG. 2. At the same time, the intermodulation signal set 111 is processed through the elements of the amplifier arm 64 to form an amplified error signal set 113 at the output of the error amplifier 26 as indicated by the signal arrow 113 in FIG. 2. The signal set 113 is exemplified in FIG. 3E by intermodulation products 114 which are similar to the intermodulation products 112 of FIG. 3D. However, their amplitudes and phases are generally different.

The amplified error signal set 113 is directed to the coupled input 85 of the output directional coupler 66. The amplified error signal set 113 combines with the amplified signal set 109 in the output directional coupler 66 to produce an output signal set 115 at the system output port 30 (indicated by the signal arrow 115 in FIG. 2). The signal set 115 includes the exemplary carriers 116A and 116B and intermodulation products 117 shown in FIG. 3F. The phase and amplitude of the amplified error signal set 113 is adjusted with the adjustable phase shifter 72 and adjustable attenuator 74 so that at least a portion of the errors in the signal set 109 are canceled to produce the signal set 115.

As in the error sensor loop 24, this phase cancellation is made broadband by matching the electrical lengths of the arms 62 and 64 of the error correction loop 26. This is accomplished by a proper selection of the time delay of the delay line 68 in the arm 62.

The effect of this error cancellation is shown by the exemplary output signals 116A and 116B of FIG. 3F. The remaining intermodulation products 117 are reduced from their carrier signals by a dbc value 118. In contrast, exemplary amplified signals 104A and 104B and their intermodulation products 105 are related by a lesser dbc value 120 as shown in FIG. 3B. Thus, the error correction loop 26 injects the error signal, which was generated by the error sensor loop 24, back into the amplified signal to correct at least a portion of the errors. In theory, the time delays, amplitude adjustments and phase adjustments in the error sensor loop 24 and error correction loop 26 can be selected to generate a perfect error signal and to perfectly correct the errors in the amplified signal with this error signal. In practice, device limitations have limited this cancellation. In the feedforward error control system 10 of FIG. 1, this practical limit was reduced by adding a second error sensor loop and a second error correction loop.

In contrast, the amplifier system 20 replaces this extensive additional hardware with predistortors 23 and 25. As indicated by their electronic symbols in FIG. 2, the predistortors have a nonlinear transfer characteristic. For example, the signal predistortor 23 has the transfer characteristic 140 shown in FIG. 4. The slope of the transfer characteristic 140 increases as the input power is increased. The transfer characteristic 142 of the signal amplifier 22 is also shown in FIG. 4. The slope of the transfer characteristic of a signal amplifier (especially, a high-power amplifier) typically decreases with increased input signal and becomes substantially flat as it approaches the saturation point 144 of the amplifier.

By properly shaping the predistortor transfer characteristic 140, the combination of the transfer characteristics 140 and 142 can form a signal transfer characteristic 146 which is more linear than the transfer characteristic 142 of the signal amplifier 22. For simplicity of illustration, the signal transfer characteristic 146 is shown to be linear. However, device limitations prevent the realization of perfect cancellation of nonlinearities in the signal amplifier 22.

Nonetheless, placing the signal predistortor 23 in series with the signal amplifier 22 (as shown in FIG. 2) substantially obtains the additional linearity (over that of the error sensor loop 24 and the error correction loop 26) which has been conventionally obtained with additional error sensor and error correction loops. In addition, this advantage is obtained with far less hardware, assembly time and alignment time.

The teachings of the invention can be realized with various conventional predistortor structures. An exemplary predistortor 150 is shown in FIG. 5 to have parallel amplifier arms 152 and 154 which are coupled by an input power splitter 156 and an output power combiner 158. The amplifier arm 152 includes an amplifier 160 in series with an adjustable phase shifter 162. The amplifier arm 154 includes amplifiers 164 and 166 which are separated by an isolation load 168 and an adjustable attenuator 170. An adjustable output attenuator 172 is coupled to the output power combiner 158.

In operation, the gain of the amplifier 160 in the arm 152 is essentially constant but the gain of amplifier 166 in the arm 154 is starting to compress because of the additional net gain through the amplifier 164 and the load 168. The attenuator 170 is preferably adjusted to reduce the signal in the non-linear arm 154 below that in the linear arm 152. The phase shifter 162 is also preferably set to achieve partial cancellation of the signals of the two arms 152 and 154 in the output combiner 158. As the gain of the amplifier 166 compresses, the output signal will then exhibit a gain expansion similar to the transfer characteristic 140 of FIG. 4.

When used as the signal predistortor 23 in FIG. 2, the phase across the predistortor 150 will also tend to linearize the phase across the combination of the signal predistortor 23 and the signal amplifier 22. The adjustable attenuator 172 can be adjusted to match the predistortor output level to the level required by the signal amplifier 22 for best overall transfer characteristic.

The error amplifier 82 is necessary because the amplitude of the error signal (111 in FIG. 2) can be quite low and the cancellation signal (113 in FIG. 2) must be large enough to match the intermodulation levels in the amplified signals (109 in FIG. 2). However, to enhance the error cancellation, additional errors contributed by the error amplifier 82 must be minimized.

Amplifier efficiency is typically increased by operating near the saturation point, e.g., the point 144 in FIG. 4. In contrast, amplifier linearity is increased by operating amplifiers well below the saturation point. Because linearity is important in the error amplifier 82, it is conventionally operated well below its saturation point. This, however, increases the cost of the amplifier (higher saturation point amplifiers are typically more costly). Also, additional power consumption is required by the higher saturation point error amplifier.

The error predistortor 25 improves the linearity of the error amplifier 82 in a manner similar to that described above for the signal amplifier 22. Accordingly, the error amplifier 82 can then be operated closer to its saturation point. This permits the choice of a lower saturation point amplifier which is less costly and uses less power.

When the teachings of the invention are applied to high-power amplifier systems, e.g., those using traveling-wave-tube amplifiers, this power reduction can be significant. In a prototype design study based upon the amplifier system 20 of FIG. 2, the power usage reduction was in the range of 3–5 db. This prototype design predicted output powers in the range of 1 kW and efficiency in the range of 20%.

A 60 dbc intermodulation cancellation goal was realized in this study. Of this total, ~20 dbc was realized by the uncorrected signal amplifier 22, ~30 dbc by the error correction loop 26 and a final ~10 dbc by the signal predistortor 23.

After the amplitudes and phases of the error sensor loop 24 have been adjusted to form the error signal (111 in FIG. 2) and the amplitudes and phases of the error correction loop 26 have been optimized to cancel the errors in the amplified signal (109 in FIG. 2), the amplifier system 20 can conceptually operate indefinitely at a high level of performance. In a practical sense, however, system changes (e.g., ambient temperature, power supply variations and parts aging) will deteriorate this performance as the amplitude and phase matches in the error sensor loop 24 and error correction loop 26 degrade.

Accordingly, a controller system is preferably included in the amplifier system 20 to adapt it to changing conditions. In this system, the generator 58 can be activated by the controller 94 to inject a low-level pilot signal into the input of the error sensor loop 24. This signal appears at the inputs 52 and 56 of the interloop directional coupler 38 as respectively amplified signal and input signal sample. If the amplitude and phase balance of the error sensor loop 24 is optimized, the error signal (111 in FIG. 2) will be minimized.

Disturbances in the amplitude and phase balance will be indicated by increases in the error signal which will be detected by the detector 87. The controller 94, e.g., a microprocessor, is configured to respond to this increase by adjusting the adjustable attenuator 42 and adjustable phase shifter 44 to restore the error sensor loop balance.

In the controller system, the generator 60 can also be activated by the controller 94 to inject a second pilot signal into the arm 32 of the error sensor loop 24. Because this appears at the input 52 of the interloop directional coupler 38 as an amplified signal without a corresponding input signal sample, it generates an amplified signal (109 in FIG. 2) and an equal error signal (111 in FIG. 2). If the amplitude and phase balance of the error correction loop 24 is optimized, these signals will cancel and the output signal (115 in FIG. 2) will be minimized.

Disturbances in the amplitude and phase balance will be indicated by increases in this output signal which will be detected by the detector 89. The controller 94 is configured to respond to this increase by adjusting the adjustable attenuator 72 and adjustable phase shifter 74 to restore the error correction loop balance.

An overload detector 175 is coupled to the input port 28 through the test directional coupler 59. It informs the controller of excessive input signals. In response, the controller can issue commands to protect sensitive circuits, e.g., a traveling-wave-tube amplifier.

The amplifier system 20 enhances the linearity of multicarrier signal amplifiers by replacing the complexity of multiple error sensor and correction loops with signal predistortion. In addition, the system facilitates lower cost error amplifiers and enhances system efficiency. Although the teachings of the invention can be applied to any amplifier type it is especially applicable to high-power amplifiers such as traveling-wave-tube amplifiers.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A linearized amplifier system, comprising:
   an input port for receiving an input signal;
   a signal amplifier for amplifying said input signal into an amplified signal, said signal amplifier having an input and an output and a signal amplifier transfer characteristic between said input and said output;
   a signal predistortor arranged in series with said signal amplifier to couple said input port with said signal amplifier input, said signal predistortor configured to have a signal predistortor transfer characteristic which provides a signal transfer characteristic for the series combination of said signal predistortor and said signal amplifier that is more linear than said signal amplifier transfer characteristic;
   an output port for receiving said amplified signal;
   a first delay element coupled between said input port and said signal amplifier output;
   a second delay element connecting said signal amplifier output and said output port; and
   an error amplifier arranged in parallel with said second delay element to couple said signal amplifier output with said output port;
   said signal predistortor, said signal amplifier and said first delay element forming an error sensor loop for comparing a sample of said amplified signal with a sample of said input signal to generate an error signal representative of errors in said amplified signal caused by nonlinearities in said signal transfer characteristic; and
   said second delay element and said error amplifier forming an error correction loop for coupling said error signal into said output port for cancellation of at least a portion of said errors.

2. The linearized amplifier system of claim 1, wherein said error amplifier has an error amplifier transfer characteristic and further including an error predistortor arranged in series with said error amplifier wherein said error predistortor has an error predistortor transfer characteristic which is configured to provide an error transfer characteristic for the series combination of said error predistortor and said error amplifier which is more linear than said error amplifier transfer characteristic.

3. The linearized amplifier system of claim 1, wherein said signal predistortor includes:
   a first amplifier;
   a second amplifier arranged in parallel with said first amplifier;
   a phase shifter having a selectable phase shift and arranged in series with one of said first and second amplifiers; and
   an attenuator having a selectable attenuation and arranged in series with the other of said first and second amplifiers.

4. The linearized amplifier system of claim 1, further including a signal coupling structure arranged to couple to said signal amplifier output, said first delay element and said error amplifier for receiving a sample of said amplified signal and a sample of said input signal and generating said error.

5. The linearized amplifier system of claim 1, further including;
   an adjustable signal attenuator; and
   an adjustable signal phase shifter, said adjustable signal attenuator and said adjustable signal phase shifter arranged in series with said signal amplifier to facilitate changes in the amplitude and phase of said input signal sample.

6. The linearized amplifier system of claim 5, wherein said error amplifier has an output coupled to said output port and further including:
   a generator arranged to couple a first tone signal with a first tone frequency into said input port;
   a detector coupled to said error amplifier output to generate a detector signal representative of the amplitude of a signal having said first tone frequency; and
   a controller arranged to receive said detector signal and configured to adjust at least one of said adjustable signal attenuator and said adjustable signal phase shifter to reduce the amplitude of said detector signal.

7. The linearized amplifier system of claim 1, further including;
   an adjustable error attenuator; and
   an adjustable error phase shifter, said adjustable error attenuator and said adjustable error phase shifter arranged in series with said error amplifier to facilitate changes in the amplitude and phase of said error signal which enhance said cancellation.

8. The linearized amplifier system of claim 7, wherein said error amplifier has an output coupled to said output port and further including:

a generator arranged to couple a second tone signal with a second tone frequency into said signal amplifier input;

a detector coupled to said output port to generate a detector signal representative of the amplitude of a signal having said second tone frequency; and a controller arranged to receive said detector signal and configured to adjust at least one of said adjustable error attenuator and said adjustable error phase shifter to reduce the amplitude of said detector signal.

9. The linearized amplifier system of claim 1, wherein said signal predistortor is configured to permit adjustment of said signal predistortor transfer characteristic to accommodate changes in said signal amplifier transfer characteristic.

10. The linearized amplifier system of claim 1, wherein said signal amplifier is a traveling-wave-tube amplifier.

11. A linearized amplifier system, comprising:

an input port for receiving an input signal;

a signal amplifier for amplifying said input signal into an amplified signal, said signal amplifier having an input and an output and a signal amplifier transfer characteristic between said input and said output, said amplifier input coupled to said input port;

an output port for receiving said amplified signal;

a first delay element coupled between said input port and said signal amplifier output;

a second delay element connecting said signal amplifier output and said output port;

an error amplifier having an error amplifier transfer characteristic; and an error predistortor arranged in series with said error amplifier, said error predistortor configured to have an error predistortor transfer characteristic which provides an error transfer characteristic for the series combination of said error predistortor and said error amplifier that is more linear than said error amplifier transfer characteristic, said error predistortor and said error amplifier arranged in parallel with said second delay element to couple said signal amplifier output with said output port;

said signal amplifier and said first delay element forming an error sensor loop for comparing a sample of said amplified signal with a sample of said input signal to generate an error signal representative of errors in said amplified signal caused by nonlinearities in said signal transfer characteristic; and said second delay element, said error predistortor and said error amplifier forming an error correction loop for coupling said error signal into said output port for cancellation of at least a portion of said errors.

12. The linearized amplifier system of claim 11, wherein said signal amplifier has a signal amplifier transfer characteristic and further including a signal predistortor arranged in series with said signal amplifier wherein said signal predistortor is configured to have a signal predistortor transfer characteristic which provides a signal transfer characteristic for the series combination of said signal predistortor and said signal amplifier that is more linear than said signal amplifier transfer characteristic.

13. The linearized amplifier system of claim 11, wherein said error predistortor includes:

a first amplifier;

a second amplifier arranged in parallel with said first amplifier;

a phase shifter having a selectable phase shift and arranged in series with one of said first and second amplifiers; and an attenuator having a selectable attenuation and arranged in series with the other of said first and second amplifiers.

14. The linearized amplifier system of claim 11, further including a signal coupling structure arranged to couple to said signal amplifier output, said first delay element and said error amplifier for receiving a sample of said amplified signal and a sample of said input signal and generating said error.

15. The linearized amplifier system of claim 11, further including;

an adjustable signal attenuator; and an adjustable signal phase shifter, said adjustable signal attenuator and said adjustable signal phase shifter arranged in series with said signal amplifier to facilitate changes in the amplitude and phase of said input signal sample.

16. The linearized amplifier system of claim 15, wherein said error amplifier has an output coupled to said output port and further including:

a generator arranged to couple a first tone signal with a first tone frequency into said input port;

a detector coupled to said error amplifier output to generate a detector signal representative of the amplitude of a signal having said first tone frequency; and a controller arranged to receive said detector signal and configured to adjust at least one of said adjustable signal attenuator and said adjustable signal phase shifter to reduce the amplitude of said detector signal.

17. The linearized amplifier system of claim 11, further including;

an adjustable error attenuator; and an adjustable error phase shifter, said adjustable error attenuator and said adjustable error phase shifter arranged in series with said error amplifier to facilitate changes in the amplitude and phase of said error signal which enhance said cancellation.

18. The linearized amplifier system of claim 17, wherein said error amplifier has an output coupled to said output port and further including:

a generator arranged to couple a second tone signal with a second tone frequency into said signal amplifier input;

a detector coupled to said output port to generate a detector signal representative of the amplitude of a signal having said second tone frequency; and a controller arranged to receive said detector signal and configured to adjust at least one of said adjustable error attenuator and said adjustable error phase shifter to reduce the amplitude of said detector signal.

19. The linearized amplifier system of claim 11, wherein said error predistortor is configured to permit adjustment of said error predistortor transfer characteristic to accommodate changes in said error amplifier transfer characteristic.

* * * * *